(12) United States Patent
Rozzi

(10) Patent No.: US 8,712,597 B2
(45) Date of Patent: Apr. 29, 2014

(54) METHOD OF OPTIMIZING AIR MOVER PERFORMANCE CHARACTERISTICS TO MINIMIZE TEMPERATURE VARIATIONS IN A COMPUTING SYSTEM ENCLOSURE

(75) Inventor: James A. Rozzi, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1120 days.

(21) Appl. No.: 12/155,930

(22) Filed: Jun. 11, 2008

(65) Prior Publication Data

US 2008/0306635 A1 Dec. 11, 2008

Related U.S. Application Data

(60) Provisional application No. 60/943,192, filed on Jun. 11, 2007.

(51) Int. Cl.
*G05D 23/00* (2006.01)
*G06F 1/20* (2006.01)

(52) U.S. Cl.
USPC .............. 700/300; 318/473; 361/679.48

(58) Field of Classification Search
USPC ............. 700/276, 299, 300, 304; 388/811, 388/907.5, 934; 318/471–473; 361/679.46–679.54, 688–697
See application file for complete search history.

(56) References Cited

U.S. PATENT DOCUMENTS

| | | | | |
|---|---|---|---|---|
| 4,817,865 A | * | 4/1989 | Wray | 236/49.3 |
| 5,557,551 A | * | 9/1996 | Craft | 702/130 |
| 6,041,850 A | * | 3/2000 | Esser et al. | 165/104.33 |
| 6,198,245 B1 | * | 3/2001 | Du et al. | 318/471 |
| 6,236,184 B1 | * | 5/2001 | Baker | 318/803 |
| 6,826,456 B1 | * | 11/2004 | Irving et al. | 700/299 |
| 6,889,908 B2 | * | 5/2005 | Crippen et al. | 236/49.3 |
| 6,961,242 B2 | * | 11/2005 | Espinoza-Ibarra et al. | 361/695 |
| 6,987,370 B2 | * | 1/2006 | Chheda et al. | 318/400.08 |
| 7,098,617 B1 | * | 8/2006 | Oljaca et al. | 318/268 |
| 7,167,778 B2 | * | 1/2007 | Yazawa et al. | 700/300 |
| 7,310,738 B2 | * | 12/2007 | Bhagwath et al. | 713/300 |
| 7,337,018 B2 | * | 2/2008 | Espinoza-Ibarra et al. | 700/19 |
| 7,349,828 B1 | * | 3/2008 | Ranganathan et al. | 702/186 |
| 7,373,268 B1 | * | 5/2008 | Viredaz et al. | 702/130 |
| 7,375,486 B2 | * | 5/2008 | Ku et al. | 318/599 |
| 7,394,217 B2 | * | 7/2008 | Marando | 318/599 |
| 7,425,812 B2 | * | 9/2008 | Goldberg | 318/610 |
| 7,545,617 B2 | * | 6/2009 | Foster, Sr. | 361/103 |
| 7,721,120 B2 | * | 5/2010 | Bodner et al. | 713/300 |
| 7,742,844 B2 | * | 6/2010 | Coxe, III | 700/300 |
| 7,751,910 B2 | * | 7/2010 | Gross et al. | 700/52 |
| 8,140,196 B2 | * | 3/2012 | Rozzi et al. | 700/300 |
| 2003/0115000 A1 | * | 6/2003 | Bodas | 702/60 |
| 2003/0137267 A1 | * | 7/2003 | Blake | 318/471 |
| 2003/0193777 A1 | * | 10/2003 | Friedrich et al. | 361/687 |
| 2005/0049729 A1 | * | 3/2005 | Culbert et al. | 700/50 |
| 2007/0055793 A1 | * | 3/2007 | Huang et al. | 710/8 |

(Continued)

*Primary Examiner* — M. N. Von Buhr

(57) ABSTRACT

A computer-implemented method optimizes air mover performance to minimize temperature variations in a computer system enclosure. The computer system includes one or more modules and at least one air mover. The method includes collecting thermal data from the modules; using the collected thermal data, determining a maximum value of the thermal data; comparing the determined maximum value of the thermal data to a current maximum value of the thermal data; using the determined and the current maximum values, determining a desired operating characteristic of the air mover; and adjusting the air mover to the desired operating characteristic.

14 Claims, 6 Drawing Sheets

(56) References Cited

U.S. PATENT DOCUMENTS

| | | | |
|---|---|---|---|
| 2007/0098374 A1* | 5/2007 | Fujiwara | 388/811 |
| 2007/0130481 A1* | 6/2007 | Takahashi et al. | 713/300 |
| 2007/0162160 A1* | 7/2007 | Chang et al. | 700/25 |
| 2007/0180117 A1* | 8/2007 | Matsumoto et al. | 709/226 |
| 2007/0234124 A1* | 10/2007 | Chen | 714/36 |
| 2007/0255430 A1* | 11/2007 | Sharma et al. | 700/20 |
| 2007/0260417 A1* | 11/2007 | Starmer et al. | 702/136 |
| 2007/0297893 A1* | 12/2007 | Alon et al. | 415/47 |
| 2008/0040622 A1* | 2/2008 | Duran et al. | 713/300 |
| 2008/0147924 A1* | 6/2008 | Lambert et al. | 710/62 |
| 2008/0205286 A1* | 8/2008 | Li et al. | 370/249 |
| 2008/0259555 A1* | 10/2008 | Bechtolsheim et al. | 361/686 |
| 2008/0288193 A1* | 11/2008 | Claassen et al. | 702/61 |
| 2008/0307134 A1* | 12/2008 | Geissler et al. | 710/110 |
| 2008/0320136 A1* | 12/2008 | Holt et al. | 709/224 |
| 2009/0044036 A1* | 2/2009 | Merkin | 713/340 |
| 2009/0077280 A1* | 3/2009 | Anderson et al. | 710/62 |
| 2010/0281094 A1* | 11/2010 | Holt et al. | 709/201 |
| 2012/0030394 A1* | 2/2012 | Bird | 710/305 |
| 2012/0173755 A1* | 7/2012 | Margulis | 709/231 |

* cited by examiner

FIG. 2

4 FAN TABLE 2 BLADES    HYST. =4

| PWM RANGE | RPM |
|---|---|
| 0 -7 | 5000 |
| 8 -15 | 5000 |
| 16 -23 | 5000 |
| 24 -31 | 5000 |
| 32 -39 | 5000 |
| 40 -47 | 5000 |
| 48 -55 | 5000 |
| 56 -63 | 5000 |
| 64 -71 | 5500 |
| 72 -79 | 6000 |
| 80 -87 | 6500 |
| 88 -95 | 7000 |
| 96 -103 | 7500 |
| 104 -111 | 8000 |
| 112 -119 | 8500 |
| 120 -127 | 9000 |
| 128 -135 | 9500 |
| 136 -143 | 10000 |
| 144 -151 | 10500 |
| 152 -159 | 11000 |
| 160 -167 | 11500 |
| 168 -175 | 12000 |
| 176 -183 | 12500 |
| 184 -191 | 13000 |
| 192 -199 | 13500 |
| 200 -207 | 14000 |
| 208 -215 | 14500 |
| 216 -223 | 15000 |
| 224 -231 | 15500 |
| 232 -239 | 16000 |
| 240 -247 | 16500 |
| 248 -255 | 17300 |

150₁

6 FAN TABLE 8 SERVERS    HYST. =4

| PWM RANGE | RPM |
|---|---|
| 0 -7 | 5000 |
| 8 -15 | 5000 |
| 16 -23 | 5000 |
| 24 -31 | 5000 |
| 32 -39 | 5000 |
| 40 -47 | 5000 |
| 48 -55 | 5000 |
| 56 -63 | 5000 |
| 64 -71 | 5500 |
| 72 -79 | 6000 |
| 80 -87 | 6500 |
| 88 -95 | 7000 |
| 96 -103 | 7500 |
| 104 -111 | 8000 |
| 112 -119 | 8500 |
| 120 -127 | 9000 |
| 128 -135 | 9500 |
| 136 -143 | 10000 |
| 144 -151 | 10500 |
| 152 -159 | 11000 |
| 160 -167 | 11500 |
| 168 -175 | 12000 |
| 176 -183 | 12500 |
| 184 -191 | 13000 |
| 192 -199 | 13500 |
| 200 -207 | 14000 |
| 208 -215 | 14500 |
| 216 -223 | 15000 |
| 224 -231 | 15500 |
| 232 -239 | 16000 |
| 240 -247 | 16500 |
| 248 -255 | 17300 |

| 8 FAN TABLE 16 SERVERS | | |
|---|---|---|
| PWM RANGE | RPM | HYST. =4 |
| 0 -7 | 5000 | |
| 8 -15 | 5000 | |
| 16 -23 | 5000 | |
| 24 -31 | 5000 | |
| 32 -39 | 5000 | |
| 40 -47 | 5000 | |
| 48 -55 | 5000 | |
| 56 -63 | 5420 | |
| 64 -71 | 5840 | |
| 72 -79 | 6260 | |
| 80 -87 | 6680 | |
| 88 -95 | 7100 | |
| 96 -103 | 7520 | |
| 104 -111 | 7940 | |
| 112 -119 | 8360 | |
| 120 -127 | 8780 | |
| 128 -135 | 9200 | |
| 136 -143 | 9620 | |
| 144 -151 | 10040 | |
| 152 -159 | 10460 | |
| 160 -167 | 10880 | |
| 168 -175 | 11300 | |
| 176 -183 | 11720 | |
| 184 -191 | 12140 | |
| 192 -199 | 12560 | |
| 200 -207 | 12980 | |
| 208 -215 | 13400 | |
| 216 -223 | 13820 | |
| 224 -231 | 14240 | |
| 232 -239 | 14660 | |
| 240 -247 | 15080 | |
| 248 -255 | 17300 | |

150_3

| 10 FAN TABLE 16 SERVERS | | |
|---|---|---|
| PWM RANGE | RPM | HYST. =4 |
| 0 -7 | 5000 | |
| 8 -15 | 5000 | |
| 16 -23 | 5000 | |
| 24 -31 | 5000 | |
| 32 -39 | 5000 | |
| 40 -47 | 5000 | |
| 48 -55 | 5000 | |
| 56 -63 | 5320 | |
| 64 -71 | 5640 | |
| 72 -79 | 5960 | |
| 80 -87 | 6280 | |
| 88 -95 | 6600 | |
| 96 -103 | 6920 | |
| 104 -111 | 7240 | |
| 112 -119 | 7560 | |
| 120 -127 | 7880 | |
| 128 -135 | 8200 | |
| 136 -143 | 8520 | |
| 144 -151 | 8840 | |
| 152 -159 | 9160 | |
| 160 -167 | 9480 | |
| 168 -175 | 9800 | |
| 176 -183 | 10120 | |
| 184 -191 | 10440 | |
| 192 -199 | 10760 | |
| 200 -207 | 11080 | |
| 208 -215 | 11400 | |
| 216 -223 | 11720 | |
| 224 -231 | 12040 | |
| 232 -239 | 12360 | |
| 240 -247 | 12680 | |
| 248 -255 | 15999 | |

150_4

METHOD OF OPTIMIZING AIR MOVER PERFORMANCE CHARACTERISTICS TO MINIMIZE TEMPERATURE VARIATIONS IN A COMPUTING SYSTEM ENCLOSURE

CROSS REFERENCE TO RELATED APPLICATIONS

This application claims priority from U.S. Provisional Application 60/943,192 filed Jun. 11, 2007 entitled "METHOD OF OPTIMIZING AIR MOVER PERFORMANCE CHARACTERISTICS TO MINIMIZE TEMPERATURE VARIATIONS IN A COMPUTING SYSTEM ENCLOSURE" the content of which is incorporated herein in its entirety to the extent that it is consistent with this invention and application.

BACKGROUND

Computer system components, such as central processing units (CPUs), chipsets, graphics cards, and hard drives, produce large amounts of heat during operation. This heat must be dissipated in order to keep these components within safe operating temperatures. Overheated components generally exhibit a shorter life span and may also cause malfunction of the computer system.

The risk of overheating increases with increasing density of computer system components. In a typical blade server, a large number of heat generating blades may be closely placed in a single system enclosure. Limited open space in the system enclosure results in reduced air circulation and correspondingly reduced heat dissipation.

Because of these heat loads, many blade server enclosures include a thermal management system that uses both active (i.e., convection) and passive (e.g., heat sinks) cooling. Convection cooling generally relies on one or more fans that operate at either fixed or variable speeds. A variable speed fan generally is best for matching air flow to heat load. However, the setting of this variable fan speed presents a design problem. Ideally, the cooling fans would operate at a speed that does not waste energy while maintaining the blades at the optimum operating temperature. More specifically, the blades may be cooled simply by operating the fans at a constant high speed. This approach causes a waste of energy when the blades are not operating at their maximum capacity. One approach is to use temperature-sensing devices in the fans, where the temperature-sensing devices directly measure how much heat the server generates in the exhaust air stream. When the fan detects that the server exhaust temperatures are increasing, the fan's microcontroller can increase fan speed. However, this approach has its limitations because servers can heat up very quickly, and the server's ROM could trip on a thermal shutdown before the fans could create enough additional cooling.

SUMMARY

A computer-implemented method optimizes air mover performance to minimize temperature variations in a computer system enclosure. The computer system includes one or more modules and at least one air mover. The method includes collecting thermal data from the modules; using the collected thermal data, determining a maximum value of the thermal data; comparing the determined maximum value of the thermal data to a current maximum value of the thermal data; using the determined and the current maximum values, determining a desired operating characteristic of the air mover; and adjusting the air mover to the desired operating characteristic.

DESCRIPTION OF THE DRAWINGS

The detailed description will refer to the following drawings, in which like numerals refer to like elements, and in which:

FIG. 2 illustrates a relationship between pulse width modulation values and revolutions per minute for exemplary cooling system configurations;

DETAILED DESCRIPTION

To remove heat from a computer system enclosure, a cooling system, and method of operation thereof, are disclosed. The computer system includes one or more modules, installed in an enclosure, that generate heat as a result of operation. The cooling system and method rely on the use of one or more air movers installed within, or adjacent to, the computer system enclosure. In an embodiment, the computer system is a blade server, the modules are blades, and the air movers are fans.

Figure 1A:
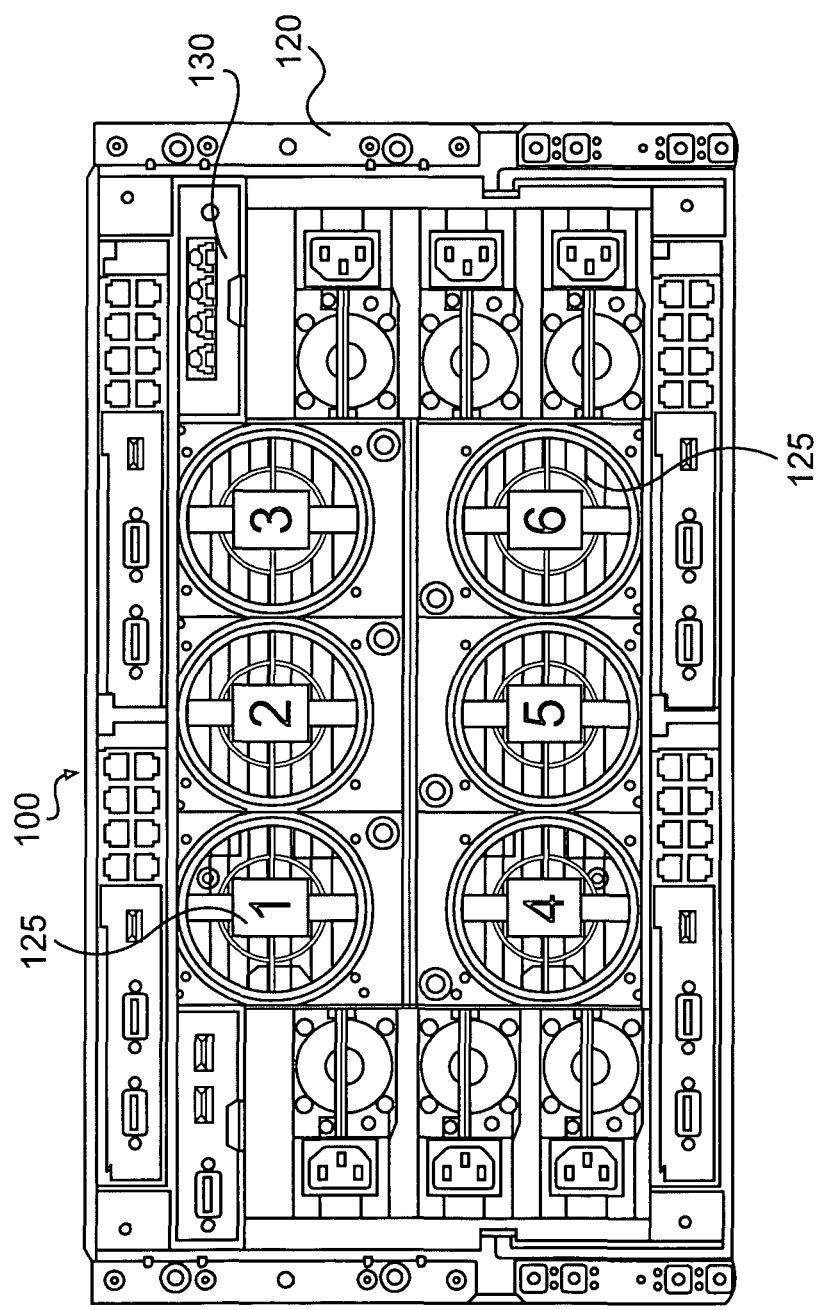
FIGS. 1A and 1B illustrate an exemplary blade server.

FIG. 1A illustrates (in a rear-end view) an exemplary server 100 having six fans 125 and on-board administrator module 130, all installed within enclosure 120. Other components installed in the enclosure 120 enable connection and operation of the server 100.

Figure 1B:
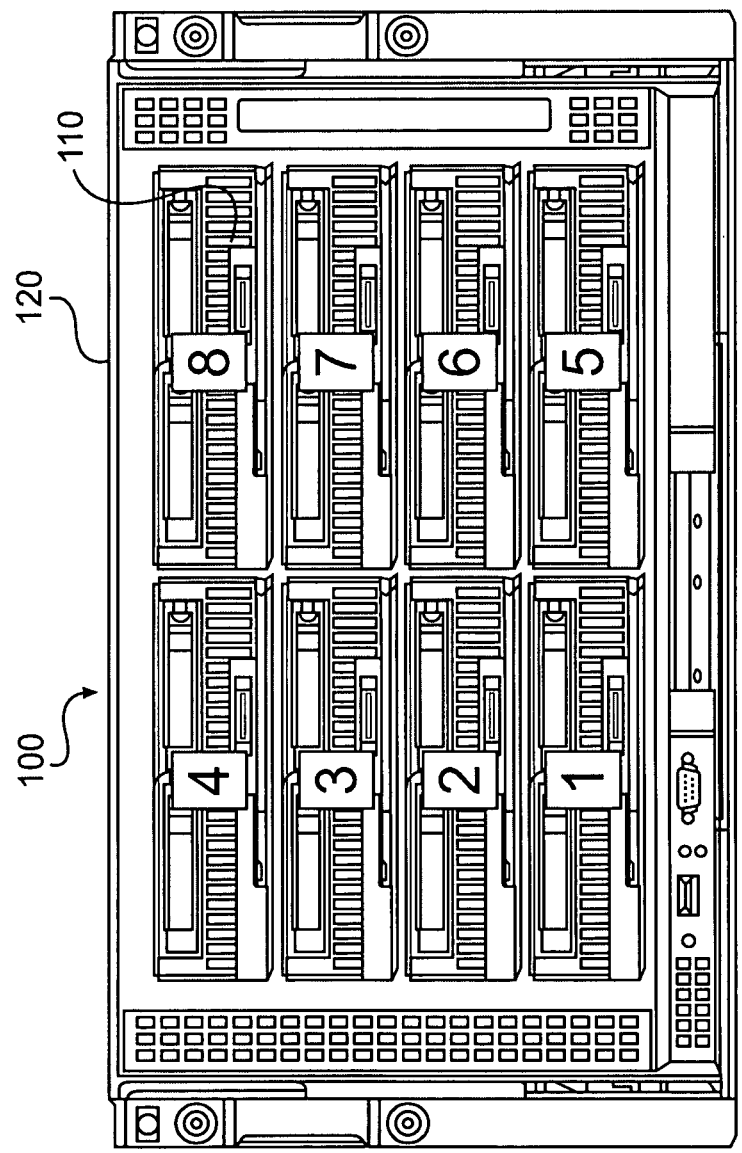

FIG. 1B illustrates a front view of the server 100 showing installed server blades 110. The fans 125 pull air over the blades 125 and exhaust the heated air at the rear of the enclosure 120.

In an embodiment, the cooling fans 125 are pulse-width modulation (PWM) fans. PWM fans are well known to those skilled in the art. The speed of a PWM fan is controlled by a PWM control signal. The fan speed response to the PWM control signal is a continuous and monotonic function of the duty cycle of the signal, from 100 percent to the minimum specified revolutions per minute (RPM).

As used hereinafter, the term "PWM fan" or "fan" refers not only to fans attached to a computer chassis, but may also be intended to signify any other computer fans, such as CPU fans, graphics processing unit (GPU) fans, chipset fans, power supply unit (PSU) fans, hard disk drive (HDD) fans, or peripheral component interconnect (PCI) slot fans. PWM fans can be of various sizes and power. Common computer fans have sizes range between 40 mm to 120 mm in diameter.

Although the fans 125 are shown as actual, physical fans, the cooling system (described later) used in conjunction with the server 100 may invoke the concept of virtual PWM fans. The concept of virtual PWM fans will be described later.

Although FIG. 1A shows the server with six fans 125, the server 100 is not so limited, and may employ more or fewer fans, depending on the server's cooling requirements. For example, the server 100 may be configured with four, six, eight, or ten fans. The number of such fans installed in the server also directly affects the efficiency of the fans in cooling the blades. That is, ten fans can cool a group of blades by running at lower RPMs that six or eight fans would run at to cool those same blades.

The fans 125 shown in FIG. 1A can operate at varying RPMs. The RPM set for a particular operating condition may be determined by the on-board administrator module 130 by reference to a fan table. FIG. 2 illustrates exemplary PWM/RPM fan tables 150 used by the on-board administrator module 130. The tables 150 are based on empirical studies and provide for correctly calibrated relationships between the fans' PWM value (PWM range) and fan RPM. The empirical studies considered various room temperatures and operating conditions, and the resulting fan tables are set so that server blades will not overheat at high room temperatures and that the fans will run at maximum efficiency in the normal room temperature range. In an embodiment, the fan tables 150 are incorporated into memory of the on-board administrator module 130, and are accessed by thermal control programs (described later) that monitor temperatures in the enclosure 120 and control the fans 125. Note also that the tables 150 specify a hysteresis value (in the embodiment shown, the hysteresis value is set at 4). By using the multiple PWM/RPM fan tables, which are correctly calibrated, the on-board administrator module 130 can ensure that the server blades 110 can stay at the same virtual PWM value and the RPM setting for the fans 125 simply are adjusted to a higher RPM setting when fewer fans are installed in the enclosure 120. Thus, the fan tables 150 allow the on-board administrator module 130 to stabilize server blade temperatures even when the number of fans 125 in the enclosure 120 changes. More specifically, as the number of working fans 125 in the enclosure 120 changes, the on-board administrator module 130 switches to the appropriate fan table. If an odd number of fans 125 are installed and operating, the on-board administrator module 130 uses the even number fan table that is lower than the odd number of working fans. If few than four fans are working, the on-board administrator module 130 uses the four fan table.

Since the enclosure 120 may contain, for example, 10 fans and 16 server blades, determination of the specific fan speed needed to cool the server blades, and then setting each fan to that speed is complicated. More specifically, each type of blade 110 may have its own unique cooling requirements. These cooling requirements depend on various factors including the number of processors on the blade, the amount of installed memory, the number of installed hard drives, and blade utilization.

To take into account all the variants, the on-board administrator module 130 incorporates a thermal management program that is used to monitor all aspects of the enclosure 120. Thermal control of the enclosure 120 is accomplished by the module 130 polling, using an intelligent platform management interface (IPMI) (not shown), the inserted blades 110 for a "virtual fan" reading. A virtual fan reading is simply the fan reading that a particular server blade 110 would need in order to ensure that server blade was adequately cooled, given its specific operating condition. That is, a "virtual" fan reading is a calculated fan speed that is based on some measurable factor associated with the blade. If the blade actually had a fan, the real fan would be able to cool the blade under its current load by running at the "virtual" fan speed. These fan readings may be determined by the blade's management module (not shown) and may be based on a temperature sensor reading on the specific blade 110 or by some other means of assessing blade operation, such as percent of total processor utilization on the blade 110, for example. These virtual fan readings may be provided by the blade's management module as a "virtual" PWM fan reading. The virtual PWM fan readings may be contained in memory provided with each blade's management module, and such readings may be chosen to reflect the unique characteristics (e.g., number of processors) of that particular blade or blade type. The on-board administrator module 130 uses the collection of these virtual PWM readings to select a specific RPM value for the fan speed. If the fans 125 are not currently operating at the determined RPM, the on-board administrator module 130 writes the necessary command to each fan to establish the new RPM fan speed.

Figure 3:
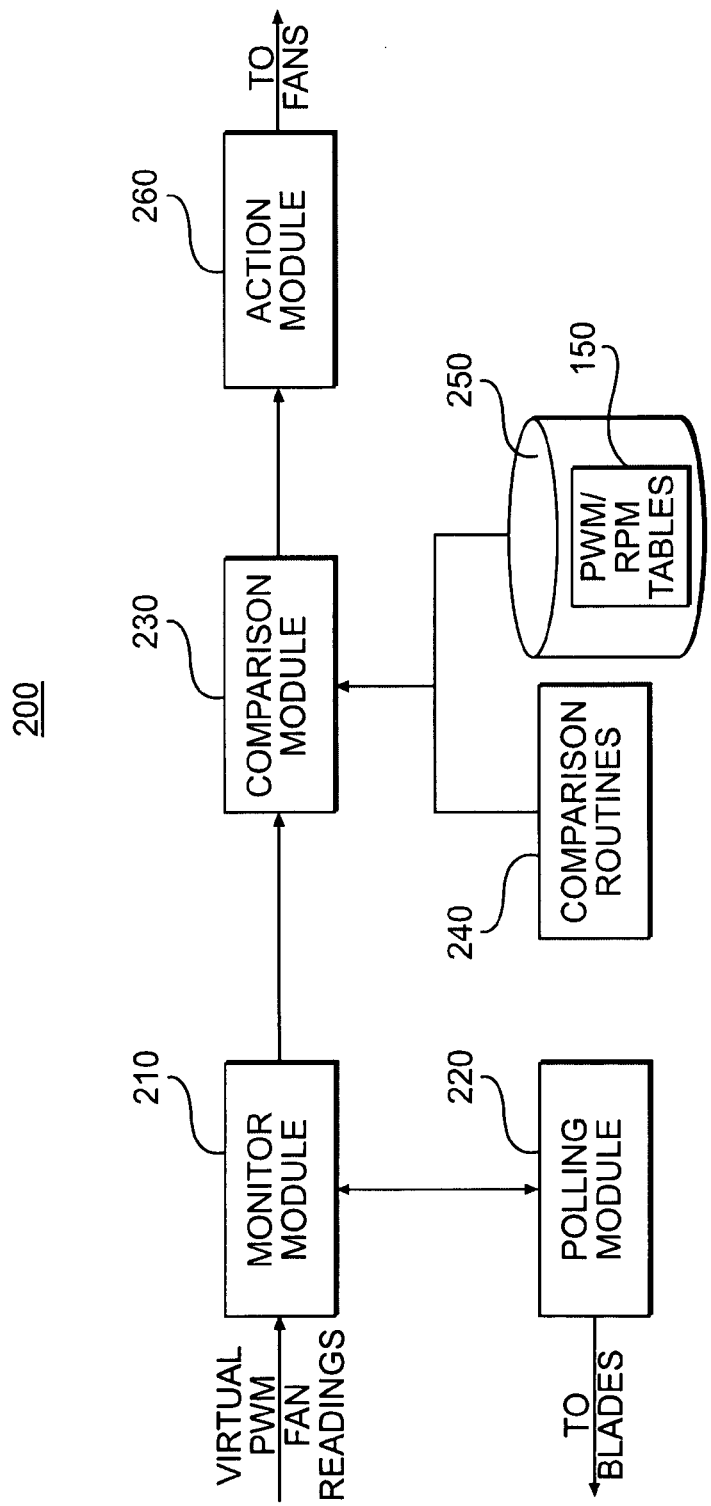
FIG. 3 is a block diagram illustrating an exemplary temperature control program implemented as part of the blade server of FIG. 1A.

FIG. 3 is a block diagram of an exemplary thermal management program 200 used by the on-board administrator module 130. The program 200 includes monitor module 210, which receives virtual PWM readings from each of the blades 110 in the enclosure 120. The blades 110 are directed to report these readings by the polling module 220. Such polling may occur periodically or aperiodically. For example, the polling may be directed every hour of normal clock time, or following startup of another server in the same computer room.

Coupled to the monitor module 210 is comparison module 230, which uses comparison routines 240 to determine if fan speed should be adjusted. The module 230 also accesses database 250 to retrieve data from the PWM/RPM tables 150 in order to determine the correct "new" RPM for the fans 125, should the executed comparison routine 240 indicate a new (higher or lower) fan speed is required. Finally, coupled to the comparison module 130 is action module 150, which is used to write commands to the fans' microcontrollers to adjust fan speed, as needed.

In determining the correct "new" RPM for the fans 125, the thermal management program 200 receives and reads the virtual PWM fan readings from all the blades 110 in the enclosure 120. The received virtual PWM fan readings are those that the individual blade's management module has calculated as the ideal setting that a fan should run at in order to cool the blade at the time the reading was requested from the polling module 220. The comparison module 230 reads the virtual PWM fan readings from all the blades and selects the maximum reading. The comparison module 230 then compares the just read maximum virtual PWM fan reading to the previous maximum reading. If the new maximum reading is greater than the previous maximum reading, the comparison module 230 uses the table 150 to look up a RPM value that maps to the new maximum PWM value. If the looked up RPM value is different from the current fan RPM setting, the action module 260 writes a command to each fan to establish the new RPM value. If the new maximum PWM reading is less than the previous PWM maximum value, the new, lower maximum PWM also is mapped to an RPM value. However, when a lower PWM value is mapped to a RPM value, a hysteresis value is applied to the PWM/RPM look up table 150. The hysteresis value prevents small increasing or decreasing PWM changes from causing constant fan RPM changes.

Although the on-board administrator module 130 sets the RPM values of the fans 125, the module 130 does not verify that the fans 125 actually go to the requested RPM. Each of the fans 125 includes a PIC microcontroller. The PIC microcontroller sends an interrupt signal to the module 130 if its associated fan cannot reach the requested RPM within a few seconds. The PIC microcontroller also send an interrupt signal whenever the PIC microcontroller detects any type of internal fan hardware problem.

In an embodiment, the on-board administrator module 130 sends the same speed control signal to all fans 125 installed in the enclosure 120. In another embodiment, the server blades 110 and fans 125 may be grouped into zones, and fan speed may be determined based on virtual PWM fan readings on a zone by zone basis. That is, fans 125 in one zone may operate at RPM different from fans 125 in another zone. In yet another embodiment, temperature data from other modules (i.e., from components other than blades) may be used to establish fan speed.

Figure 4:
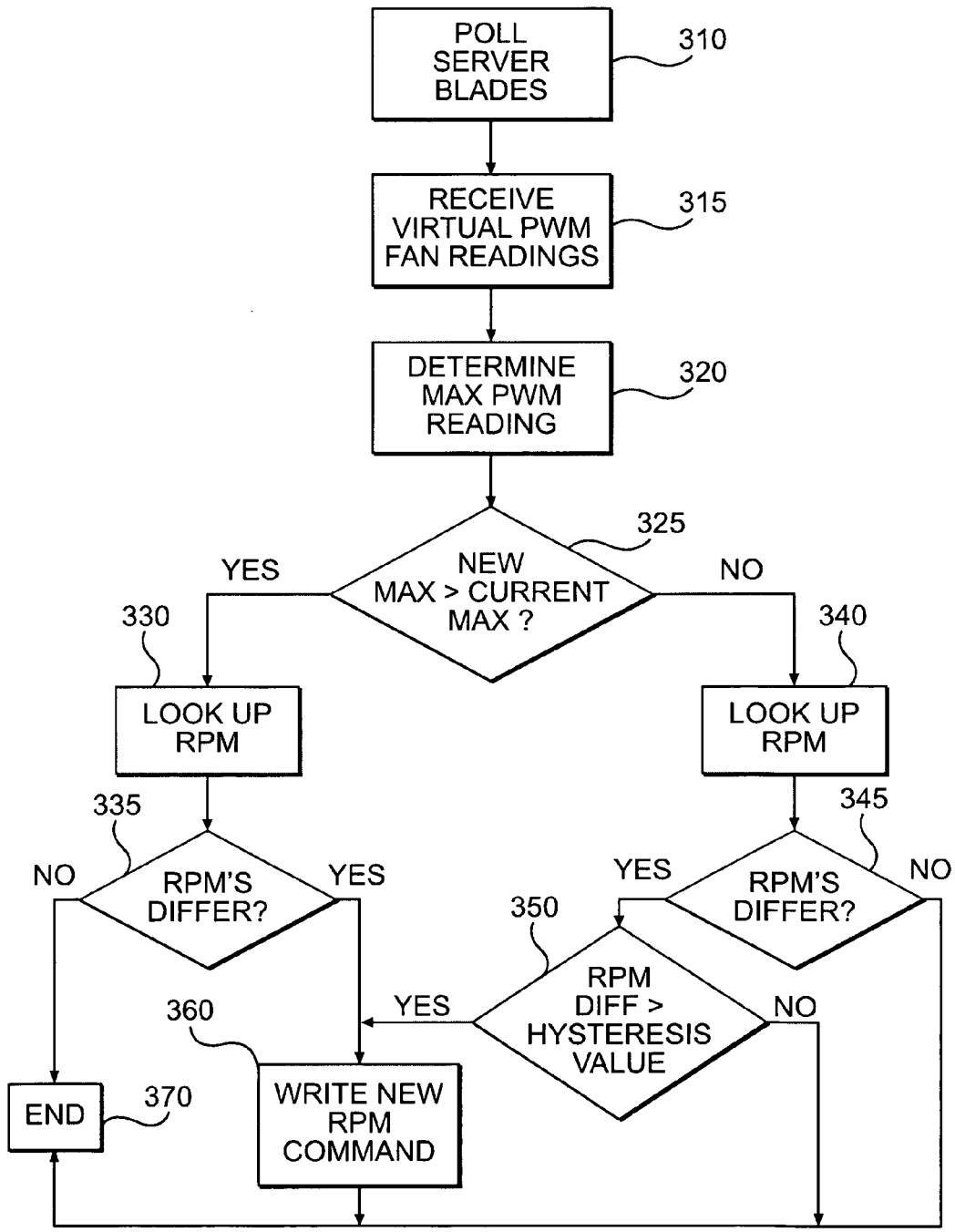
FIG. 4 is a flowchart illustrating an exemplary method for optimizing air mover performance.

FIG. 4 is a flowchart illustrating an exemplary, computer-implemented method 300 for optimizing air mover performance characteristics to minimize temperature variations in a computer system such as the server 100 of FIG. 1A. The method 300 begins, block 310, when the polling module 220 sends a request to each of the blades 110 to report virtual PWM fan readings. In block 315, the monitor module 210 receives the readings and in block 320, the comparison module determines a maximum virtual PWM fan reading from the polling results.

In block 325, the comparison module 230 compares the newly determined maximum virtual PWM fan reading to the current maximum. If the new maximum is greater than the current maximum, the method 300 moves to block 330 and the comparison module 230, using the PWM/RPM table 150, looks up the RPM corresponding to the new maximum virtual PWM reading. In block 335, the comparison module 230 determines if the looked up RPM differs from the current fan RPM (theoretically, any such difference would be such that the looked up RPM is greater than the current RPM). In block 335, if the RPM do not differ, the method 300 moves to block 370 and ends. If in block 335, the RPM differ, the method 300 moves to block 360 and the action module 260 writes a command to each fan 125 to achieve the looked up RPM. The method 300 then ends, block 370.

Returning to block 325, if the new maximum virtual PWM fan reading is not greater than the current maximum, the method 300 moves to block 340 and the comparison module 230 looks up the RPM corresponding to the new maximum virtual PWM fan reading (which is less than or equal to the current maximum). The method 300 then moves to block 345 where the looked up RPM is compared to the fans' current RPM. If the RPMs differ, the method moves to block 350 and the comparison module 230 determines if the RPM difference is within the range of the hysteresis value. If the RPM difference is greater than the hysteresis value, the method moves to block 360, and the action module writes a command to each fan 125 indicating the desired new RPM (which should be less than the current RPM). The method 300 then ends, block 370. If in block 350, the RPM difference is within the hysteresis range, the method moves to block 370 and ends.

Returning to block 345, if the RPMs do not differ, the method 300 moves to block 370 and ends.

As noted above, the thermal control program 200 of FIG. 3 interacts with the blades 110 through a intelligent platform management interface (IPMI). This interface operates independently of any operating system (OS) and allows administrators to manage the blade server remotely even in the absence of the OS or system management software, or even if the monitored system is not powered on. The IPMI also can function when the OS has started, and offers enhanced features when used with system management software.

In the various embodiments in accordance with the present invention, embodiments are implemented as a method, system, and/or apparatus. As one example, exemplary embodiments are implemented as one or more computer software programs to implement the methods described herein. The software is implemented as one or more modules (also referred to as code subroutines, or "objects" in object-oriented programming). The location of the software will differ for the various alternative embodiments. The software programming codes, for example, is accessed by a processor or processors of the computer or server from long-term storage media of some type, such as a CD-ROM drive or hard drive. The software programming code is embodied or stored on any of a variety of known media for use with a data processing system or in any memory device such as semiconductor, magnetic and optical devices, including a disk, hard drive, DC-ROM, ROM, etc. The code is distributed on such media, or is distributed to users from the memory or storage of one computer system over a network of some type to other computer systems for use by users of such other systems. Alternatively, the programming code is embodied in the memory (such as memory of the handheld portable electronic device) and accessed by the processor using the bus. The techniques and methods for embodying software programming code in memory, on physical media, and/or distributing software code via networks are well known and will not be further discussed herein.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A computer-implemented method for optimizing air mover performance to minimize temperature variations in a computer system enclosure, the computer system including one or more modules and at least one air mover, the method comprising:
    collecting virtual PWM fan readings from the modules, wherein said virtual PWM fan readings are not based on a temperature reading from a temperature sensor;
    using the collected virtual PWM fan readings, determining a maximum value of the virtual PWM fan readings;
    comparing the determined maximum value of the virtual PWM fan readings to a current maximum value of a current RPM reading;
    using the determined and the current maximum values, determining a desired operating characteristic of the air mover; and
    adjusting the air mover, through an Intelligent Platform Management Interface (IPMI), to the desired operating characteristic.

2. The method of claim 1, wherein the computer system is a server and the modules are server blades.

3. The method of claim 2, wherein the air mover is a pulse-width modulation (PWM) fan.

4. The method of claim 3, wherein the computer system comprises multiple cooling fans running at the same RPM.

5. The method of claim 3, wherein the computer system comprises multiple cooling fans running at different RPMs.

6. The method of claim 5, wherein fan RPM is calculated for each of the multiple cooling fans based on data of modules other than said server blades.

7. The method of claim 1, wherein determining the desired operating characteristic, comprises:
    comparing the virtual PWM fan readings to a calibrated set of fan RPM settings;
    selecting a RPM reading corresponding to a maximum virtual PWM fan reading; and
    comparing the selected RPM reading to a fan current RPM reading.

8. The method of claim 7, wherein if the selected RPM reading is greater than the fan current RPM reading, the method comprises writing a command to adjust fan RPM to the selected RPM reading.

9. The method of claim 7, wherein if the selected RPM reading is less than or equal to the fan current RPM reading, the method comprises comparing the selected RPM reading to a hysteresis value.

10. The method of claim 9, wherein if the selected RPM reading exceeds the hysteresis value, the method comprises writing a command to adjust fan RPM to the selected RPM reading.

11. The method of claim 9, wherein if the selected RPM reading is less than or equal to the hysteresis value, the method comprises retaining the fan current RPM reading.

12. A computer-implemented method for optimizing air mover performance characteristics in a computer system enclosure, the enclosure including one or more server blades, and one or more fans operating as air movers, the method comprising:
- (a) receiving a virtual PWM fan reading from each of the one or more server blades, wherein said virtual PWM fan reading is not based on a temperature reading from a temperature sensor;
- (b) determining a new maximum virtual PWM fan reading based on the received readings;
- (c) determining if the new maximum PWM fan reading differs from a current maximum virtual PWM fan reading, wherein if the new maximum exceeds the current maximum, the method comprises:
  - (c)(1) determining a new fan RPM corresponding to the new maximum PWM fan reading,
  - (c)(2) determining if the new fan RPM exceeds a current fan RPM, and
  - (c)(3) if the new fan RPM exceeds the current fan RPM, writing a command, through an Intelligent Platform Management Interface (IPMI), to adjust fan speed to the new fan RPM; and
- (d) wherein if the new maximum is less than or equal to the current maximum, the method comprises:
  - (d)(1) determining a new fan RPM corresponding to the new maximum PWM fan reading, and
  - (d)(2) determining if the new fan RPM differs from the current fan RPM, wherein if the RPMs differ, the method comprises:
    - (d)(2)(i) determining if the new fan RPM is within a hysteresis range, and
    - (d)(2)(ii) if the new fan RPM is outside the hysteresis range, writing a command, through an Intelligent Platform Management Interface (IPMI), to adjust fan speed to the new fan RPM.

13. The computer-implemented method of claim 12, wherein the new fan RPM, the current fan RPM, the new maximum virtual PWM fan reading, and the current maximum virtual PWM fan readings are contained in a look up table calibrated according to a number of server blades and fans.

14. A non-transitory computer readable storage media comprising computer code for implementing a method for optimizing air mover performance characteristics in a computer system enclosure, the enclosure including one or more server blades, and one or more fans operating as air movers, the method comprising:
- (a) receiving a virtual PWM fan reading from each of the one or more server blades, wherein said virtual PWM fan reading is not based on a temperature reading from a temperature sensor;
- (b) determining a new maximum virtual PWM fan reading based on the received readings;
- (c) determining if the new maximum PWM fan reading differs from a current maximum virtual PWM fan reading, wherein if the new maximum exceeds the current maximum, the method comprises:
  - (c)(1) determining a new fan RPM corresponding to the new maximum PWM fan reading,
  - (c)(2) determining if the new fan RPM exceeds a current fan RPM, and
  - (c)(3) if the new fan RPM exceeds the current fan RPM, writing, through an Intelligent Platform Management Interface (IPMI), a command to adjust fan speed to the new fan RPM; and
- (d) wherein if the new maximum is less than or equal to the current maximum, the method comprises:
  - (d)(1) determining a new fan RPM corresponding to the new maximum PWM fan reading, and
  - (d)(2) determining if the new fan RPM differs from the current fan RPM, wherein if the RPMs differ, the method comprises:
    - (d)(2)(i) determining if the new fan RPM is within a hysteresis range, and
    - (d)(2)(ii) if the new fan RPM is outside the hysteresis range, writing a command, through an Intelligent Platform Management Interface (IPMI), to adjust fan speed to the new fan RPM.

* * * * *